(12) United States Patent
Mueller

(10) Patent No.: US 8,441,613 B2
(45) Date of Patent: *May 14, 2013

(54) PROJECTION OBJECTIVE AND PROJECTION EXPOSURE APPARATUS FOR MICROLITHOGRAPHY

(75) Inventor: Ralf Mueller, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 245 days.

This patent is subject to a terminal disclaimer.

(21) Appl. No.: 13/050,346

(22) Filed: Mar. 17, 2011

(65) Prior Publication Data

US 2011/0164235 A1    Jul. 7, 2011

Related U.S. Application Data

(63) Continuation of application No. 12/129,161, filed on May 29, 2008, now Pat. No. 7,929,115.

(60) Provisional application No. 60/941,369, filed on Jun. 1, 2007.

(51) Int. Cl.
| | |
|---|---|
| *G03B 27/54* | (2006.01) |
| *G03B 27/42* | (2006.01) |
| *G03B 27/70* | (2006.01) |
| *G03B 27/68* | (2006.01) |
| *G03B 27/72* | (2006.01) |

(52) U.S. Cl.
USPC ............... 355/67; 355/52; 355/53; 355/66; 355/71

(58) Field of Classification Search .......... 355/52, 355/53, 55, 60, 66–71; 359/351, 355, 359, 359/576, 586; 250/492.1, 492.2, 492.22, 250/493.1, 548

See application file for complete search history.

(56) References Cited

U.S. PATENT DOCUMENTS

| | | | |
|---|---|---|---|
| 5,052,763 A | 10/1991 | Singh et al. | |
| 5,963,365 A | 10/1999 | Shirai | |
| 6,252,647 B1 | 6/2001 | Shiraishi | |
| 6,587,288 B2 | 7/2003 | Erz et al. | |
| 6,829,084 B2 | 12/2004 | Takaki et al. | |
| 7,053,986 B2 | 5/2006 | Kato et al. | |
| 2003/0179356 A1 | 9/2003 | Schuster et al. | |
| 2004/0125459 A1 | 7/2004 | Tanitsu et al. | |
| 2005/0151942 A1 | 7/2005 | Kawashima | |
| 2005/0225737 A1* | 10/2005 | Weissenrieder et al. | 355/53 |
| 2005/0248856 A1 | 11/2005 | Omura et al. | |
| 2006/0050261 A1 | 3/2006 | Brotsack | |
| 2006/0055907 A1 | 3/2006 | Kato et al. | |
| 2006/0221456 A1* | 10/2006 | Shafer et al. | 359/649 |
| 2007/0070859 A1 | 3/2007 | Hirayama | |
| 2008/0049306 A1 | 2/2008 | Omura et al. | |
| 2008/0094599 A1 | 4/2008 | Scheible et al. | |
| 2008/0165415 A1* | 7/2008 | Chan et al. | 359/351 |
| 2008/0315134 A1* | 12/2008 | Ehm et al. | 250/504 R |
| 2010/0097592 A1* | 4/2010 | Kraehmer et al. | 355/67 |

FOREIGN PATENT DOCUMENTS

| | | |
|---|---|---|
| EP | 1 480 065 | 11/2004 |
| JP | 2004-302113 | 10/2004 |
| WO | WO 2004/019128 | 3/2004 |
| WO | WO 2005/006905 | 1/2005 |

(Continued)

*Primary Examiner* — Toan Ton
*Assistant Examiner* — Christina Riddle
(74) *Attorney, Agent, or Firm* — Fish & Richardson P.C.

(57) ABSTRACT

Projection objectives, projection exposure apparatuses and related systems and components are disclosed.

31 Claims, 10 Drawing Sheets

FOREIGN PATENT DOCUMENTS

| WO | WO 2005/069055 | 7/2005 |
| WO | WO 2006/005547 | 1/2006 |
| WO | WO 2006/125617 | 11/2006 |
| WO | WO 2007/025783 | 3/2007 |

* cited by examiner

PROJECTION OBJECTIVE AND PROJECTION EXPOSURE APPARATUS FOR MICROLITHOGRAPHY

CROSS-REFERENCE TO RELATED APPLICATION

This application is a continuation of U.S. application Ser. No. 12/129,161, filed May 29, 2008, which claims priority under 35 U.S.C. §119(e)(1) to U.S. Provisional Application No. 60/941,369, filed on Jun. 1, 2007. The contents of these applications are hereby incorporated by reference.

FIELD

The present disclosure relates to a projection objective and a projection exposure apparatus configured to be used in a microlithography process. The apparatus can be used to expose a radiation-sensitive substrate, arranged in the region of an image surface of the projection objective, with at least one image of pattern of a mask arranged in the region of an object surface of the projection objective. The present disclosure also relates to related components and methods.

BACKGROUND

Microlithographic projection exposure methods are used for fabricating semiconductor components and other finely structured components. Use is made of masks (reticles) that bear the pattern of a structure to be imaged, for example a line pattern of a layer of a semiconductor component, such as an integrated circuit (IC). A mask is positioned in a projection exposure apparatus between an illumination system and projection objective in the region of the object surface of the projection objective, and illuminated with illumination radiation provided by the illumination system. The radiation varied by the mask and the pattern forms projection radiation propagating through the projection objective, which images the pattern of the mask onto the substrate to be exposed, which normally bears a radiation-sensitive layer (photoresist).

A certain fraction of energy of radiation used for the exposure process is absorbed by optical elements within the projection objective, the amount of absorption typically being dependent on the material subject to radiation energy. Energy absorption typically causes heating of the optical elements subject to the radiation. The heating of lens groups and other optical elements caused by radiation energy will be referred to as "lens heating" in the following. Lens heating may cause surface deformations of optical elements and/or changes of refractive index of transparent materials directly through increasing the temperature and/or indirectly by mechanical strain caused by heating. Both refractive index changes and surface deformations of optical surfaces cause changes of the optical properties of single optical elements as well as of optical systems including a plurality of optical elements.

Lens heating is typically not considered in standard processes for designing optical systems. Therefore, typical optical designs are optimized for a "cold condition" not accounting for lens heating effects. However, lens heating may cause deterioration of optical properties in optical systems optimized for "cold condition" during operation. Optical performance may still be acceptable where operation conditions are met which do not cause significant lens heating effects. Lens heating effects occurring during operation of a projection exposure apparatus may be compensated for by providing appropriate manipulation devices capable of dynamically influencing the imaging properties of a projection objective, for example by actively moving and/or deforming selected optical elements.

While a compensation of lens heating effects through external manipulation devices may be possible where the lens heating is essentially uniform or rotationally symmetric on important optical elements, compensation may be difficult where non-uniform lens heating effect occurs on important optical elements. For example, where a projection objective is designed to image an off-axis object field onto an off-axis image field, the radiation load on optical elements close to field surfaces (i.e. object surface, image surface, optional intermediate images) may be non-rotationally symmetric. Further, state-of-the-art projection exposure methods often use off-axis illumination, which enables smaller features to be faithfully imaged. With this technique a mask providing the pattern is illuminated at oblique (non-perpendicular) angles, which may improve resolution, but particularly improves the process latitude by increasing depth of focus (DOF) and/or contrast. Off-axis illumination modes include multipole illumination in which an intensity distribution at a pupil plane of the illumination system acting as an effective source is characterized by several poles (spatially confined regions of high intensity) which are not on the optical axis (off-axis). The spatial intensity distribution at the pupil surface is converted into an angular distribution at the plane of the mask and further creates corresponding non-uniform irradiation loads particularly in optical elements of the projection objective arranged at or close to a pupil surface of the projection objective optically conjugated to the pupil plane of the illumination system where the effective source is generated.

SUMMARY OF THE DISCLOSURE

In some embodiments, the disclosure provides a projection objective having a low level of aberrations caused by lens heating particularly under conditions where non-uniform heating of optical elements may occur.

In some embodiments, the disclosure provides a projection objective that includes a plurality of optical elements having optical surfaces arranged to image an object surface of the projection objective onto an image surface of the projection objective with ultraviolet radiation having an operating wavelength 155 nm$\leq \lambda_0 \leq$250 nm forming a radiation beam. The radiation beam including a plurality of rays incident on the optical surfaces with a plurality of respective angles of incidence, AOI, defining, for each location on an optical surface, a local maximum angle of incidence, $AOI_{MAX}$, a local minimum angle of incidence, $AOI_{MIN}$, and a local range of angles of incidence, $\Delta AOI = AOI_{MAX} - AOI_{MIN}$. For each optical surface a global maximum angle of incidence, $AOI_{MAXG}$ is the maximum angle of incidence occurring on the respective optical surface. At least one of the optical elements is a lens element that has at least one lens surface having a surface shape and a surface position such that the global maximum angle of incidence, $AOI_{MAXG}$, exceeds a critical angle $A_C = 40°$ and for which the local range of angles of incidence, $\Delta AOI$, is equal to or less than the critical angle $A_C$ for all locations on the lens surface. A low absorption antireflection coating having at least one layer of dielectric material is applied to that lens surface. The low absorption antireflection coating is a graded antireflection coating. A geometrical layer thickness of the at least one layer of the antireflection coating varies as a function of the location of the lens surface such that, for each location on the lens surface, the antireflection coating is effective to reduce reflection in the respective local range of angles of incidence.

It has been found that the critical angle $A_C$ may be smaller than 40° in many cases. In some embodiments, the condition $A_C=35°$ holds for the critical angle.

The global maximum angle of incidence, $AOI_{MAXG}$, may be more than 40°. In some embodiments $AOI_{MAXG}$ exceeds 50° and/or 55° and/or 60° on at least one of the lens surfaces.

In some embodiments, the condition $A_C=35°$ holds for the critical angle and the global maximum angle of the incidence, $AOI_{MAXG}$, exceeds the critical angle by at least 10°. In such embodiments, the global maximum angle of incidence $AOI_{MAXG}$ may exceed 50° or 55° or 60° on one or more of the lens surfaces.

In some embodiments the low absorption antireflection coating has three or less layers of dielectric material.

In some embodiments the low absorption antireflection coating has exactly three layers of dielectric material. A good compromise between efficiency to reduce reflections and low absorption level may thereby be obtained.

It has been found that, under certain irradiation conditions, antireflection coatings typically used on lenses to reduce reflection and to increase transmittance may contribute significantly to the generation of heat on lens elements subject to high intensity ultraviolet radiation in a radiation beam passing through a projection objective. Heat generated in an antireflection coating typically adds to heat generated in the transparent material used for the lens substrate. Therefore, utilizing highly transparent materials, such as fused silica or certain alkaline fluoride crystal materials, such as calcium fluoride, for the body of lenses may not be sufficient to reduce or avoid lens heating effects detrimental for the optical performance during operation. Utilizing low absorption antireflection coatings having a relatively simple structure with a small number of layers, such as three, two or only one layer of dielectric material applied to a lens surface allows to reduce significantly the generation of heat on coated lens elements subject to irradiation. Therefore, contributions to lens heating effects originating in absorption-induced heating of antireflection coatings may be avoided or reduced.

Where the number of single layers of an antireflection coating is kept low, the overall volume of coating material may typically be kept small. Also, the number of interfaces between adjacent materials (substrate and first layer, first layer and optional following layers) may be kept small. Since imperfections at and close to interfaces in the region of an antireflection coating are believed to contribute to absorption-induced heating effects, limiting the number of interfaces, for example to four or less interfaces, may contribute to suppress lens-heating effects. Primarily, those imperfections may contribute to generating stray light. Increased roughness one surfaces, however, may facilitate contamination of interfaces, which in turn may contribute to absorption induced heating.

Therefore, it may be desirable to use low absorption antireflection coatings having a small number of single dielectric layers on many or all lens surfaces in a projection objective. However, the desired optical effect of antireflection coatings (reducing the reflectivity of the optical surfaces coated with an AR-coating) should also be considered when an AR-coating is designed. It is known that "simple" antireflection coatings, for example AR-coatings with three or less layers, may be optimized to yield very good antireflective properties for rays impinging on the coating substantially perpendicular to the coated surface, i.e. at angles of incidence AOI close to 0°. For example, U.S. Pat. No. 5,963,365 discloses 3-layer antireflection coatings allowing almost zero reflections at AOI=0° (compare FIG. 3).

However, the angular bandwidth of those "simple" AR-coating may be rather limited. As used herein, the term "angular bandwith" denotes a range of angles of incidence around a given center angle of incidence for which the reflectance provided by the antireflective coating lies below a critical threshold value. The threshold value may be 2% residual reflection or less and/or 1% residual reflection or less. In many cases the critical threshold value is significantly smaller than 1% residual reflection, for example 0.5% residual reflection or less. The angular bandwidth is sometimes referred to as "acceptance range" of a coating.

For example, the 3-layer AR-coating of U.S. Pat. No. 5,963,365 allows reflectance values smaller than about 0.3% for angles of incidence between 0° and 30°, where the reflectance increases significantly beyond the threshold angle of incidence such that, for example, the residual reflectance exceeds about 0.5% at angles of incidence larger than about 35° and is more than 1% at angles of incidence of about 40° or more. Due to the relatively narrow angular bandwidth those 3-layer AR-coatings are conventionally used on surfaces which are subject to radiation only at angles of incidence smaller or equal to 30°, for example. Antireflection coatings with more than three layers are typically employed where a larger angular bandwidth is desired. For example, U.S. Pat. No. 5,963,365 discloses a second embodiment of an AR-coating having four layers stacked upon each other, where the incidence-angle characteristics are improved to angles of approximately AOI=+45° (FIG. 7). Where a significant antireflection effect is desired in a larger range of angles of incidence, the number of single layers in a multilayer antireflection coating is typically increased even more, e.g. to obtain multilayer coatings with five or six or more single dielectric layers.

State-of-the-art high-aperture projection objectives for microlithography used to faithfully print structures with typical structure sizes in the order 100 nm or less often include a number of lenses having lens surfaces subject to very large angles of incidence, such as AOI>50° or even AOI>60°. Those lens surfaces are typically coated with AR-coatings having a large number of single layers to reduce reflection for all angles of incidence occurring on the optical surface. Those complex AR-coatings may be disadvantageous from an absorption point of view and may contribute to undesirable lens heating effects which may be difficult to compensate particularly, if the radiation load on the respective lens is not rotationally symmetric to the optical axis.

Providing a graded antireflection coating allows to "tailor" the geometrical layer thickness of the simple, low-absorption antireflection coating by "tuning" the coating thickness, thereby shifting the center angle of incidence of a respective range of angles of incidence into the region required on the respective location of the lens surface.

This aspect of the disclosure allows to extend the field of applicability of low-absorption antireflection coatings, such as antireflection coatings having three or less layers, and solves the conflict between the requirements of obtaining an effective reduction of residual reflections on the one hand and of avoiding absorption-induced heating on the other hand.

In some embodiments the geometrical layer thickness of the layers of the antireflection coating increases from a center region around an optical axis of the lens element towards an edge region of the lens element by at least 10%. Optionally, the geometrical thickness increases by 20% or more or even 25% or more. In some embodiments, the geometrical thickness at the edge region is more than 30% larger than in the center region. Where such significant change of layer thickness is applied, the region of maximum antireflection effect of the coating can be shifted from relatively small angles of incidence around the center region towards much higher angles of incidence close to the edge of a lens element.

In some embodiments the dielectric material used for the at least one layer of the antireflection coating is essentially free of absorption at an operating wavelength of the projection objective. Such dielectric materials will be denoted as "absorption-free material" in the following. Such absorption-free material may be described with a complex refractive index $N=n-ik$, wherein n is the real refractive index and k is the absorption index (or the extinction coefficient) at the operating wavelength. The absorption coefficient k is typically below $10^{-6}$ for absorption-free materials.

In some embodiments the antireflection coating has a first layer, directly applied to the lens surface, a second layer applied to the first layer, and a third layer applied to the second layer, wherein the first layer is made of a first low refractive index material, the second layer is made of the second high-refractive index material, and the third layer is made of a third, low refractive index material. The first and third low refractive index materials may be identical or different. The first layer may have a optical layer thickness of from $0.05\lambda_0$ to $0.15\lambda_0$, the second layer may have an optical film thickness of from $0.2\lambda_0$ to $0.35\lambda_0$ and the third layer may have an optical film thickness of from $0.2\lambda_0$ to $0.3\lambda_0$.

The low refractive index materials used for the first and third layer may be selected from magnesium fluoride, aluminium fluoride, sodium fluoride, lithium fluoride, calcium fluoride, barium fluoride, strontium fluoride, cryolite, chiolite, and combinations thereof.

The high refractive index material used for the second layer may be selected from neodymium fluoride, lanthanum fluoride, gadolinium fluoride, dysprosium fluoride, aluminium oxide, lead fluoride, yttrium fluoride, and combinations thereof.

The first and third low refractive index layers may be formed from different low refractive index materials, or from the same material. Typically, the high-refractive material has a refractive index that is higher than the refractive index of the substrate material.

Low absorption AR-coatings with simple structure may be applied to one or more of the lens surfaces of the projection objective. Typical projection objectives may have 30 or more lens surfaces, such as 40 or more lens surfaces and/or 50 or more lens surfaces. Typically, the global maximum angle of incidence, $AOI_{MAXG}$, exceeds the critical angle $A_C$ at more than one lens surface. For example, the condition $AOI_{MAXG}>A_C$ may be fulfilled for two or three or four or five or six or seven or eight or nine or ten or more of the lens surfaces. Further, amongst those lens surfaces some or all may be suitable for applying a low-absorption antireflection coating. In some embodiments, at least 60% or at least 70% or at least 80% or at least 90% of all the lens surfaces fulfilling the condition $AOI_{MAXG}>A_C$ and $\Delta AOI<A_C$ are coated with a graded, low-absorption antireflection coating, whereby the detrimental effects of lens heating caused by heating of antireflection coatings may be suppressed to relatively uncritical levels.

In some embodiments the projection objective has at least one pupil surface between the object surface and the image surface, wherein at least one lens surface arranged in a pupil space optically close to the pupil surface is coated with a low-absorption anti-reflection coating of the type mentioned above. For the purpose of this application, the pupil space is defined as a region around the pupil surface where the marginal ray height MRH is substantially greater than the chief ray height CRH such that the condition $RHR<|B|<<1$ is fulfilled for the ray height ratio $RHR=|CRH/MRH|$. The upper limit B of the ray height ratio may be smaller than 0.5 or smaller than 0.4 or smaller than 0.3, for example.

In projection objectives incorporated in a projection exposure apparatus capable of generating non-rotational symmetric off-axis illumination, such as dipole illumination or quadrupole illumination, lens surfaces at or close to a pupil surface of the projection objective are typically irradiated with a light intensity distribution similar to the light intensity distribution of the effective light source formed by the illumination system. If, for example, dipole illumination is used, absorption-induced heat on optical surfaces close to the pupil surface will be generated in two spatially confined regions of high radiation load diametrically opposed to each other and spaced apart from the optical axis. A corresponding distortion and/or refractive index change of the lens will not be rotational symmetric and, therefore, hard to compensate with a conventional compensation mechanism. Those radiation induced effects may particular influence the field variation of certain aberrations, i.e. the variation of the level of a certain aberration across the image field, since an angle in a pupil surface corresponds directly to a defined location in the field surface, which is a Fourier-transformed surface to the pupil surface. Applying low absorption antireflection coatings to one or more of those important lens surfaces may contribute to reducing the negative effects of lens heating particularly where off-axis illumination modes, such as dipole illumination or quadrupole illumination, are used in an exposure process.

In some embodiments the projection objective is a catadioptric projection objective designed for imaging an off-axis object field arranged in the object surface into an off-axis image field arranged in the image surface of the projection objective and includes at least one concave mirror. The projection objective may have at least one intermediate image. Catadioptric projection objectives with off-axis fields are frequently used where an imaging free of vignetting and pupil obscuration is desired at high image-side numerical apertures, such as NA>0.8 and where it is desired to avoid utilizing a physical beam splitter having a polarization selective beam splitter surface. Those catadioptric projection objectives may have one or two planar folding mirrors, or may be designed without a folding mirror as an in-line system having one straight optical axis common to all optical elements. Catadioptric projection objectives with off-axis fields, at least one concave mirror and at least one intermediate image are disclosed, for example, in WO 2004/019128, EP 1 480 065 A1 or WO 2005/069055 A2.

The projection objective may be adapted with regard to imaging aberrations to a dry process where the image space between an exit surface of the projection objective and the image surface is filled with a gas having refractive index close to 1 (dry objectives). Those projection objectives may have an image-side numerical aperture NA>0.8<1. Some embodiments are adapted to immersion lithograpy, wherein the projection objective is designed as an immersion objective adapted with regard to imaging aberrations to a wet process where the image space between an exit surface of the projection objective and the image surface is filled with an immersion medium having refractive index significantly larger than 1. Although NA<1 is possible in these cases, the projection objective may have an image-side numerical aperture NA>1.0 when used in connection with an immersion medium having refractive index $n_I>1.3$. For example, NA>1.1 or NA>1.2 or NA>1.3.

In some embodiments, a projection objective includes: a first refractive objective part to generate a first intermediate image from radiation coming from the object surface and including a first pupil surface; a second objective part including at least one concave mirror to image the first intermediate image into a second intermediate image and including a second pupil surface optically conjugated to the first pupil surface; and a third refractive objective part to image the second intermediate image onto the image surface and including a third pupil surface optically conjugated to the first and second pupil surface.

Embodiments may have exactly two intermediate images.

The second objective part may have exactly one concave mirror close to or at the second pupil surface and the projection objective may have a first folding mirror for deflecting radiation coming from the object surface in the direction of the concave mirror, or for deflecting radiation coming from the concave mirror towards the image surface. A second folding mirror may be provided for deflecting radiation coming from the concave mirror or the first deflecting mirror in the direction of the image surface. The deflecting mirrors may both be planar.

In some embodiments the second objective part has exactly two concave mirrors, each optically remote from a pupil surface. The embodiment may be designed without folding mirrors and may have one straight optical axis common to all optical elements (in-line system).

An object surface and an image surface may be planar and parallel to each other.

Known projection objectives may be analyzed with respect to occurrence of lens surfaces which may be optimized with respect to absorption-induced heating effects by applying a low-absorption antireflection coating as mentioned above instead of conventional antireflection coatings having more than three single layers of dielectric material. On the other hand, future projection objectives may be designed in a targeted manner in order to reduce the number of optical surfaces which need to have complex antireflection coatings (typically with four or more single layers) to effectively reduce reflections.

The disclosure also provides a method of manufacturing a projection objective. The method includes defining a plurality of merit function components, each of which reflects a particular quality parameter. One of the merit function components defines an angle of incidence requirement requiring that at least one of a surface shape and a surface position of at least one lens surfaces having a global maximum angle of incidence, $AOI_{MAXG}$ larger than a critical angle $A_C$ and local ranges of angles of incidence, $\Delta AOI$, exceeding the critical angle in one or more locations is adjusted such that the local range of angles of incidence, $\Delta AOI$, is equal to or smaller than the critical angle $A_C$ for all locations on the lens surfaces. The method also includes computing a numerical value for each of that merit function components based on a corresponding feature of a preliminary design of the projection objective. The method further includes computing from that merit function components an overall merit function expressible in numerical terms that reflect quality parameters. In addition, the method includes successively varying at least one structural parameter of the projection objective and recomputing a resulting overall merit function value with each successive variation until the resulting overall merit function reaches a predetermined acceptable value. The method also includes obtaining the structural parameters of the optimized projection objective having the predetermined acceptable value for the resulting overall merit function, and implementing the parameters to make the projection objective.

The overall layout of the projection objective can be optimized in view of the goal to obtain many lens surfaces which may be effectively optimized with respect to transmittance by utilizing simple, low-absorption antireflection coatings as described in detail above. The critical angle may be $A_C=35°$.

The disclosure also provides a projection exposure apparatus that includes a light source, an illumination system and a projection objective as described herein.

In some embodiments, the projection exposure apparatus includes a light source generating primary radiation, and an illumination system that includes a plurality of optical elements constructed and arranged to receive the primary radiation and to generate illumination radiation incident on a mask bearing a pattern. The illumination system also includes a number of the optical elements forming a pupil-shaping unit configured to generate a defined spatial intensity distribution corresponding to selected illumination mode in a pupil surface of the illumination system. The spatial intensity distribution being a multipolar intensity distribution includes at least one substantially dipolar intensity distribution having at least two illumination poles positioned outside an optical axis of the illumination system. The projection exposure apparatus further includes a projection objective projecting an image of the pattern onto a radiation-sensitive substrate with projection radiation guided along a projection path.

The individual features may be implemented either alone or in combination as embodiments of the disclosure, or may be implemented in other fields of application. Further, they may represent advantageous embodiments that are prosecutable in their own right, for which protection is claimed in the application as filed or for which protection will be claimed during pendency of the application.

DETAILED DESCRIPTION

In the following description, the term "optical axis" refers to a straight line or a sequence of a straight-line segments passing through the centers of curvature of optical elements. The optical axis can be folded by folding mirrors (deflecting mirrors) such that angles are included between subsequent straight-line segments of the optical axis. In the examples presented below, the object is a mask (reticle) bearing the pattern of a layer of an integrated circuit or some other pattern, for example, a grating pattern. The image of the object is projected onto a wafer serving as a substrate that is coated with a layer of photoresist, although other types of substrates, such as components of liquid-crystal displays or substrates for optical gratings, are also feasible.

Where appropriate, corresponding features in the figures are designated with like or identical reference identifications to facilitate understanding.

A number of known projection objectives designed for immersion lithography at very high image-side numerical aperture NA>1 have been analyzed and modified to improve the stability of optical performance under conditions where "lens heating" may negatively influence the optical performance of the projection objectives during operation. Stability of optical performance under those conditions has been improved by applying low-absorption antireflection coatings to selected optical surfaces.

Figure 1:
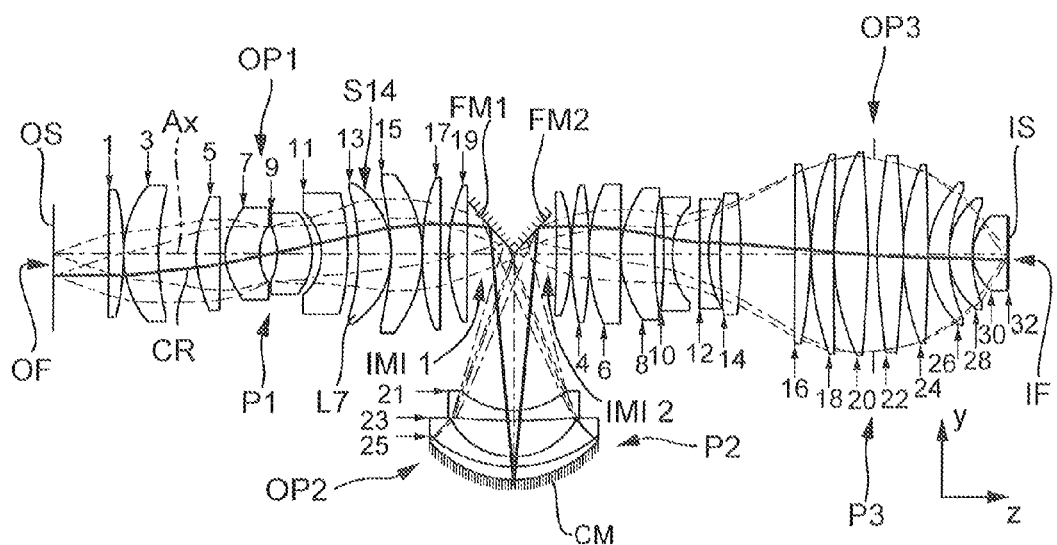
FIG. 1 illustrates a lens section of a first embodiment of a catadioptric projection objective with lenses coated according to an aspect of the disclosure.

FIG. 1 shows a catadioptric projection objective 100. The projection objective is designed for a nominal UV-operating wavelength $\lambda=193$ nm. The layout of the projection objective with regard to number, shape, position of lenses and other optical elements is taken from the prior art projection objective shown in FIG. 19 and discussed as embodiment 5 (Tables 9 and 10) in international patent application WO 2004/019128 A2. The respective disclosure of that reference is incorporated herein by reference. An image-side numerical aperture NA=1.25 is obtained at a reducing magnification 4:1 in a rectangular off-axis image field with size 26 mm×4 mm.

Projection objective 100 is designed to project an image of a pattern on a reticle arranged in the planar object surface OS (object plane) into the planar image surface IS (image plane) on a reduced scale, for example, 4:1, while creating exactly two real intermediate images IMI1, IMI2. The rectangular effective object field OF and image field IF are off-axis, i.e. entirely outside the optical axis AX. A first refractive objective part OP1 is designed for imaging the pattern in the object surface into the first intermediate image IMI1. A second, catadioptric (refractive/reflective) objective part OP2 images the first intermediate image IMI1 into the second intermediate image IMI2 at a magnification close to 1:(−1). A third, refractive objective part OP3 images the second intermediate image IMI2 onto the image surface IS with a strong reduction ratio.

The path of the chief ray CR of an outer field point of the off-axis object field OF is drawn bold in FIG. 1 in order to facilitate following the beam path of the projection beam. For the purpose of this application, the term "chief ray" (also known as principal ray) denotes a ray running from an outermost field point (farthest away from the optical axis) of the effectively used object field OF to the center of the entrance pupil. Due to the rotational symmetry of the system the chief ray may be chosen from an equivalent field point in the meridional plane as shown in the figures for demonstration purposes. In projection objectives being essentially telecentric on the object side, the chief ray emanates from the object surface parallel or at a very small angle with respect to the optical axis. The imaging process is further characterized by the trajectory of marginal rays. A "marginal ray" as used herein is a ray running from an axial object field point (field point on the optical axis) to the edge of an aperture stop. That marginal ray may not contribute to image formation due to vignetting when an off-axis effective object field is used. The chief ray and marginal ray are chosen to characterize optical properties of the projection objectives. The radial distance between such selected rays and the optical axis at a given axial position are denoted as "chief ray height" (CRH) and "marginal ray height" (MRH), respectively.

Three mutually conjugated pupil surfaces P1, P2 and P3 are formed at positions where the chief ray CR intersects the optical axis. A first pupil surface P1 is formed in the first objective part between object surface and first intermediate image, a second pupil surface P2 is formed in the second objective part between first and second intermediate image, and a third pupil surface P3 is formed in the third objective part between second intermediate image and the image surface IS.

The second objective part OP2 includes a single concave mirror CM at the second pupil surface P2. A first planar folding mirror FM1 is arranged optically close to the first intermediate image IMI1 at an angle of 45° to the optical axis AX such that it reflects the radiation coming from the object surface in the direction of the concave mirror CM. A second folding mirror FM2, having a planar mirror surface aligned at right angles to the planar mirror surface of the first folding mirror, reflects the radiation coming from the concave mirror CM in the direction of the image surface, which is parallel to the object surface. The folding mirrors FM1, FM2 are each located in the optical vicinity of an intermediate image.

The projection objective has 27 lenses including two negative meniscus lenses immediately in front of the concave mirror CM and passed twice by radiation on its way from first folding mirror FM1 towards the concave mirror, and from the concave mirror towards the second folding mirror FM2. Each of the lens surfaces is coated with an antireflection coating (also denoted AR-coating) to reduce reflection losses at the lens surfaces and thereby to increase transmittance T of the coated lens surface. Dielectric multilayer antireflection coatings having a number of stacked layers of dielectric materials with different refractive index are used, where typically layers of relatively high refractive index material and layers of relatively low refractive index material are stacked alternately on top of each other.

The radiation beam passing from the object surface OS towards the image surface IS is formed by a plurality of rays incident on the optical surfaces with a plurality of respective angles of incidence, AOI. In this application, the angle of incidence (AOI) of a ray on an optical surface is the angle included between the propagation direction of the ray impinging on the optical surface, and the surface normal N to the optical surface at the location of incidence (see FIG. 9). As a plurality of non-parallel rays is incident on each location on an optical surface, a local maximum angle of incidence, $AOI_{MAX}$ and a local minimum of incidence, $AOI_{MIN}$ may be defined for the ray having the largest angle of incidence and the smallest angle of incidence, respectively. Further, a local range of angles of incidence, $\Delta AOI = AOI_{MAX} - AOI_{MIN}$ may be defined for each location on an optical surface. Typically, some locations on an optical surface have smaller ranges of angles of incidence than other locations. Therefore, an optical surface may also be characterized by a maximum range of angles of incidence, $\Delta AOI_{MAX}$, which corresponds to the largest value of a range of angles of incidence occurring on an optical surface. Further, as the angles of incidents typically vary across the optical surface, the surface may be characterized by a global maximum angle of incidence, $AOI_{MAXG}$, which is the maximum angle of incidence occurring on the respective optical surface.

Figure 2:
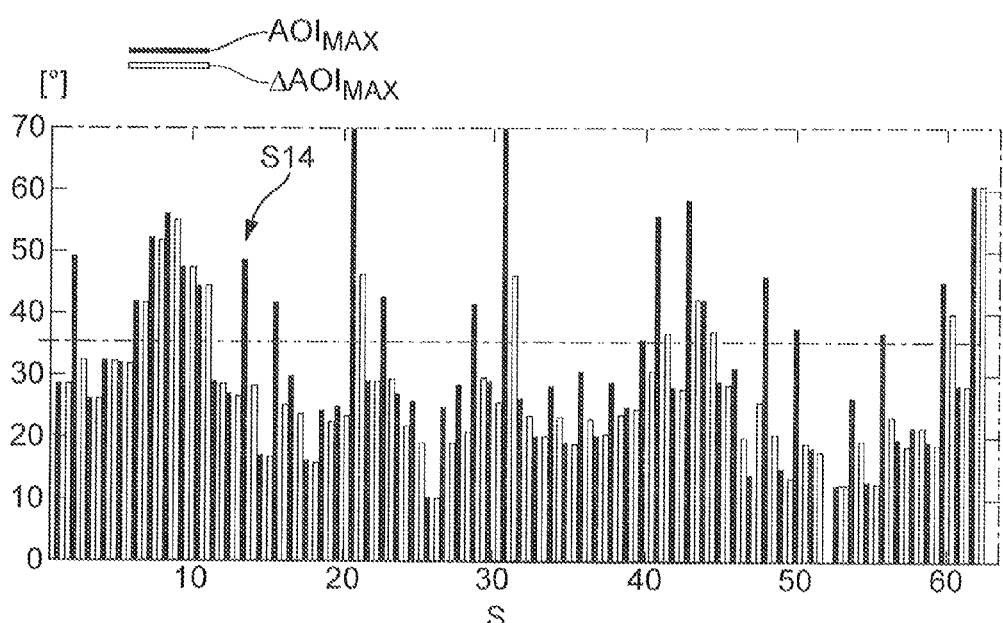
FIG. 2 is a bar diagram showing for each optical surface with a surface number S of the embodiment of FIG. 1, a pair of bars indicating the maximum angle of incidence, $AOI_{MAX}$ and the maximum value of the local ranges of angles of incidence, $\Delta AOI_{MAX}$.

The optical surfaces in FIG. 1 have been analyzed with regard to the values of the maximum angle of incidence, $AOI_{MAX}$, and the maximum range of angles of incidence, $\Delta AOI_{MAX}$ occurring on each of the surfaces. In the representation of FIG. 2, each optical surface S numbered on the abscissa of the diagram is characterized by pair of two vertical bars, wherein the right bar of each pair, appearing dark in the representation, represents the maximum angle of incidence, and wherein the left bar of a pair (appearing bright) represents the maximum range of angles of incidence.

Now consider a critical angle of incidence, $A_C$, which is selected as $A_C=35°$ for the purpose of this embodiment. This critical angle is considered critical from a coating point of view. As mentioned above, each of the optical surfaces is coated with an antireflection coating to reduce reflection losses. According to the analysis of the inventors, highly effective dielectric antireflection coatings with low absorption, e.g. AR-coatings having three or less single dielectric layers, may be used for lens surfaces subject to radiation with a maximum angle of incidence of about 35°. In contrast, where the maximum angle of incidence exceeds this critical angle significantly, antireflection coatings with a complex multilayer structure, e.g. having four, five, six or more single layers, are typically used to reduce reflections. Therefore, from a conventional point of view, lenses with a maximum angle of incidence $AOI_{MAX} < A_C$ may be coated with a low absorption antireflection coating e.g. having three or less layers.

In accordance with the analysis of the inventors, it has been found that further lens surfaces, having maximum angles of incidence $AOI_{MAX}$ significantly larger than $A_C=35°$ may also be coated with such low-absorption antireflection coatings. Specifically, such coatings are used in FIG. 1 for some or all lens surfaces where $AOI_{MAX} > 35°$ and where, at the same time, the maximum range of angles of incidence, $\Delta AOI_{MAX}$ is smaller than the critical angle $A_C=35°$. As evident from FIG. 2, this particular set of conditions applies to six lens surfaces, namely surfaces S3, S14, S16, S23, S29, S40, S48, S50 and S56.

Figure 3:
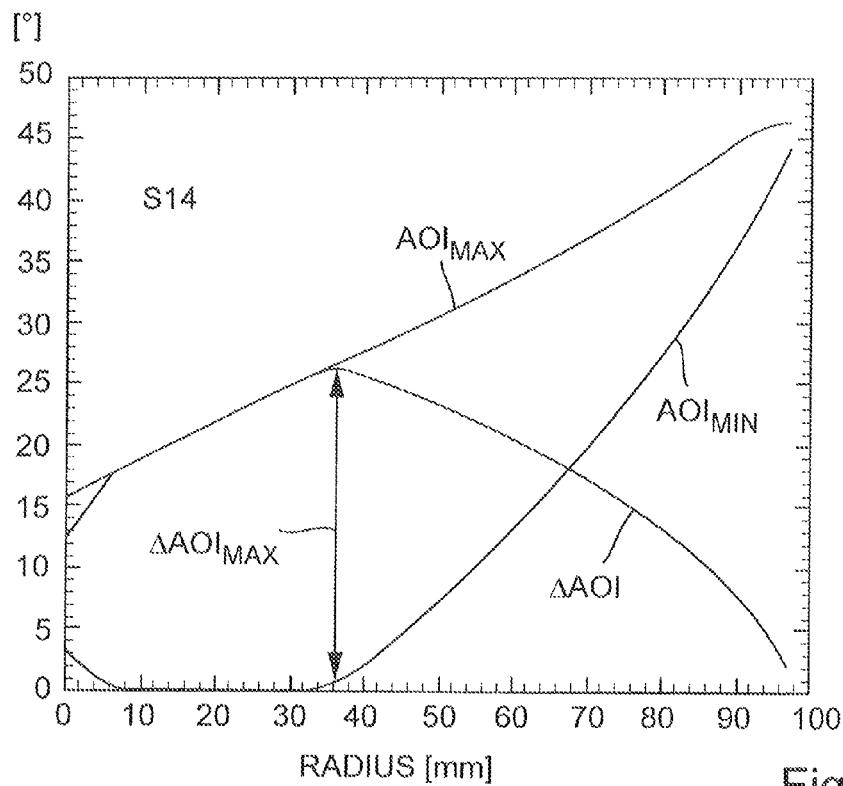
FIG. 3 is a diagram showing, for surface S14 in FIG. 1, the maximum angle of incidence, $AOI_{MAX}$, the minimum angle of incidence, $AOI_{MIN}$, and the range of angles of incidence, $\Delta AOI$, as a function of the radius coordinate of the lens surface between the optical axis (radius=0) and the outer edge of the lens.
Figures 4A, 4B:
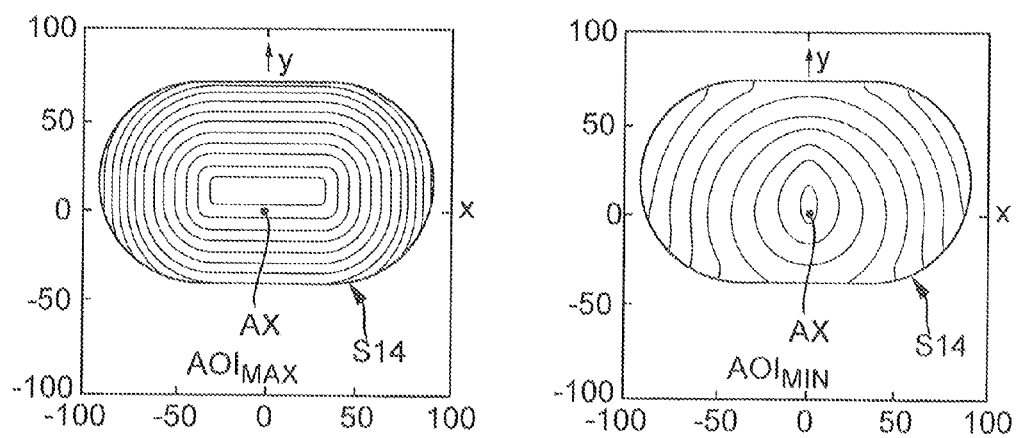
FIG. 4A shows a footprint of the radiation beam on surface S14 of FIG. 1 with contour lines indicating given levels of maximum angles of incidence $AOI_{MAX}$, between about 15° close to the center and 47° close to the outer edge of the footprint area.
FIG. 4B shows a footprint of the radiation beam on surface S14 of FIG. 1 with contour lines indicating given levels of minimum angles of incidence, $AOI_{MIN}$, between about 3° close to the center and 44° close to the outer edge of the utilized area.

FIGS. 3 and 4A, 4B are used to further explain the angular load (represented by the amount and spatial distribution of angles of incidence) of one of those selected surfaces, namely surface S14. Lens surface S14 is the convex exit surface of a positive meniscus lens L7 arranged in the first objective part OP1 in an intermediate zone between the first pupil surface P1 and the first intermediate image IMI1 at a position where the ray height ratio RHR is about 1 indicating that the optical surface is optically remote from both the pupil surface (P1) and the next field surface (intermediate image IMI1).

FIG. 3 shows how the maximum angle of incidence, $AOI_{MAX}$, the minimum angle of incidence, $AOI_{MIN}$, and the local range of angles of incidence, $\Delta AOI = AOI_{MAX} - AOI_{MIN}$ varies in radial direction between the region of the optical axis (radius=0) and the outer edge of the lens (radius about 98 mm). It is evident that the maximum angle of incidence monotonically increases from about 16° at the optical axis to about 45° at the edge of the lens. The minimum angle of incidence has very small values of 3° or less in a region from 0° to about 36° and then increases up to about 45° at the edge of the lens. The resulting local range of angles of incidence for a given radius value therefore increases between radius=0 and radius ~36° and then decreases towards the edge of the lens. The maximum range of angles of incidence, $\Delta AOI_{MAX}$ graphically depicted in FIG. 2, is reached in a zone at radius=36 mm, where the absolute value of the maximum range of angles of incidence is about 26°.

In order to demonstrate the local distribution of minimum and maximum angles of incidence, FIGS. 4A and 4B show the optically used area of lens surface S14 (footprint) with contour lines indicating selected values for the maximum angle of incidence, $AOI_{MAX}$ in FIG. 4A, and the minimum angle of incidence, $AOI_{MIN}$ in FIG. 4B. The shape of the footprint resembles a low aspect ratio rectangle with rounded edges indicating that the lens surface S14 is optically arranged about half way between a pupil surface (P1) and a field surface (IMI1). Note that the projection objective of FIG. 1 has a circular pupil and is designed for a rectangular off-axis field, whereby a footprint on a lens surface close to a pupil surface will be essentially circular, whereas a footprint on a lens surface close to a field surface (object surface, image surface or intermediate image surface) will be essentially rectangular with the aspect ratio of the utilized field.

In FIG. 4A, the inner contour line corresponds to $AOI_{MAX}=15°$, whereas the outer contour line corresponds to $AOI_{MAX}=47°$. In FIG. 4B, the inner contour line corresponds to $AOI_{MIN}=3°$ and the outer contour line corresponds to $AOI_{MIN}=44°$. Whereas the representations in FIGS. 4A and 4B correspond to a local (spatial) distribution on the mirror in an x-y-plane perpendicular to the optical axis AX, the representation in FIG. 3 shows the respective values in radial coordinates between the center of the lens and the outer edge. As evident from FIG. 4A, the value for $AOI_{MAX}$ varies for different positions along a circle around the optical axis corresponding to a given radial coordinate. The line $AOI_{MAX}$ in FIG. 3 shows the maximum value of all values on a circle representing a given radial distance from the optical axis. Similar considerations hold for the lines $AOI_{MIN}$ and $\Delta AOI$ in FIG. 3, which each refer to radial coordinates rather than coordinates in an x-y-coordinate system.

FIGS. 5 to 9 are now used to illustrate considerations for appropriate selection and design of multilayer antireflection coatings for lens surfaces. As a general rule, coatings with a small number of single layers, such as three or less layers, may be sufficient in case of normal incidence (AOI=0°) and in cases of near normal incidence, for example up to AOI=30° to 40°. On the other hand, where larger angles of incidence are considered, multilayer coatings with a significantly larger number of single layers, such as six single layers, are typically used. However, using a larger number of single layers will typically increase the tendency of antireflection coating to absorb incident light energy and, thereby, to contribute to lens heating under high energy density irradiation.

Figure 5:
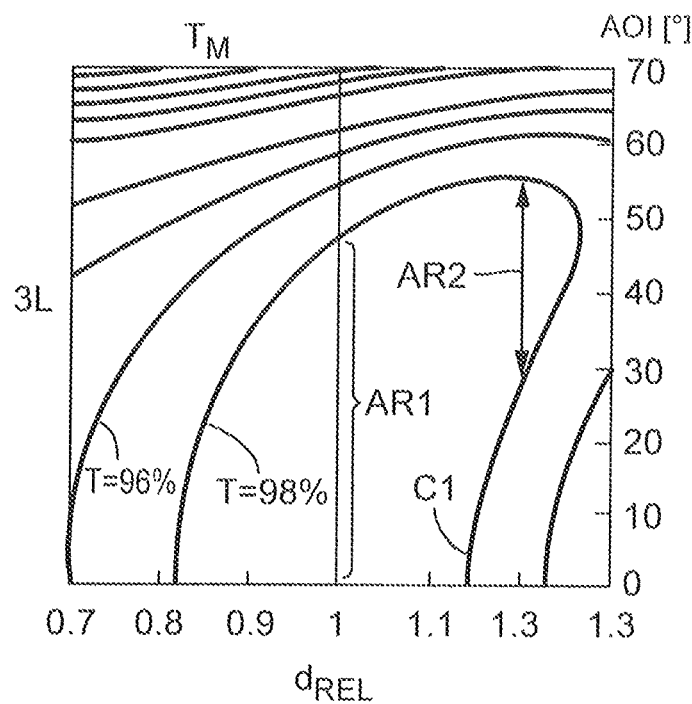
FIG. 5 shows a diagram with contour lines presenting a given value for the average transmittance $T_M$ of a coated optical surface as a function of the relative geometrical thickness $d_{REL}$ of single layers of the multilayer coating and the angle of incidence, AOI, of radiation on the coated optical surface for an antireflection coating with three single layers (3L)
Figure 6:
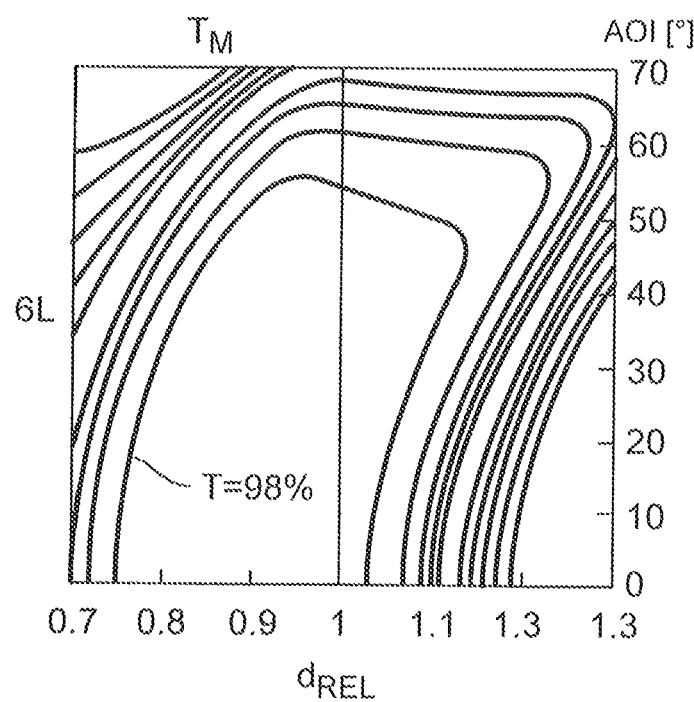
FIG. 6 shows a diagram with contour lines presenting a given value for the average transmittance $T_M$ of a coated optical surface as a function of the relative geometrical thickness $d_{REL}$ of single layers of the multilayer coating and the angle of incidence, AOI, of radiation on the coated optical surface for an antireflection coating with six single layers (6L)

FIGS. 5 and 6 are used to demonstrate a way out of this problem. In the figures, the average transmittance $T_M$ of a coated substrate is plotted using contour lines enclosing regions where the average transmittance is larger than a given threshold value (the contour lines connecting the respective points of the threshold value). In the abscissa, the relative geometrical layer thickness, $d_{REL}$, of the layers of the respective antireflection coating is given, where a relative thickness $d_{REL}=1$ corresponds to the nominal thickness values of the layers optimized for the maximum value of $\Delta AOI$ needed, and where a value $d_{REL}=1.1$, for example, corresponds to an increase of the layer thicknesses in the layer by 10% with respect to the nominal thickness values. The ordinate shows respective angles of incidence AOI [°].

FIG. 5 shows data for a simple 3-layer antireflection coating taken from embodiment 1 from U.S. Pat. No. 5,963,365. The AR-coating is designed for an operating wavelength $\lambda_0=193.4$ nm, but may be used anywhere within a wavelength range from 150 nm to 300 nm. The coating consists of a first layer immediately coated on the lens surface, a second layer coated on the first layer, and a third layer coated on the second layer and adjacent to the environment. The first layer has geometrical layer thickness $0.1\lambda_0$ and is made from low refractive index magnesium fluoride ($MgF_2$) having a refractive index $n=1.44$ at $\lambda_0$. The second layer is made of high refractive index Lanthanum fluoride ($LaF_3$) with $n=1.69$ and has $0.30\lambda_0$ nominal layer thickness. The third layer is made of low refractive index magnesium fluoride and has a nominal layer thickness $0.25\lambda_0$.

The inner contour line C1 represents a transmittance value $T_M=98°$. Without considering absorption effects this corresponds to a residual reflectance R=2%. The step width between adjacent contour lines is 2% transmittance (or reflectance). It can be seen that relatively low residual reflection smaller than this threshold value can be obtained at the nominal thickness ($d_{REL}=1$) in a first acceptance range AR1 including incidence angles between 0° and about 48°. The acceptance range may even be increased when the nominal thickness is increased by about 10%. Remarkably, the acceptance range may be shifted towards higher maximum angle of incidence values, if the nominal thickness is further increased, for example, for $d_{REL}=1.2$. The acceptance range has been shifted towards higher angles of incidence such that transmittance values $T_M>98\%$ or better are obtained in a slightly narrower second acceptance range AR2 between AOI=30° and AOI=56°. These considerations show that the center angle of incidence of a respective range of angles of incidence may be "tuned" towards higher angles of incidence by increasing the respective geometrical layer thicknesses of the single layers of the 3-layer antireflection coating. With other words, the low absorption 3-layer antireflection coating may also be used at higher angles of incidence under conditions where it is not necessary for the coating to be effective both for the higher angles of incidence and for smaller angles of incidence around AOI=0°. This capability of "tuning" the position and width of the acceptance range of such simple antireflection coating is used to optimize the designs by forming graded multilayer coatings, as explained in more detail in connection with FIG. 9.

FIG. 6 shows a similar representation for an antireflection coating having six single layers. The specific design is taken from table 1 in WO 2007/025783 A2, which is incorporated herein by reference. The nominal design of the 6-layer coating is as follows:

| Layer | 1 | 2 | 3 | 4 | 5 | 6 |
|---|---|---|---|---|---|---|
| Material | $LaF_3$ | $MgF_2$ | $LaF_3$ | $MgF_2$ | $LaF_3$ | $MgF_2$ |
| OT | 0.34 | 0.11 | 0.35 | 0.19 | 0.15 | 0.22 | where OT is the optical layer thickness defined as the product of geometrical layer thickness and refractive index in units of the operating wavelength $\lambda_0 = 193$ nm.

It is evident that a large range of angles of incidence is effectively accepted at the nominal geometrical layer thickness ($d_{REL}=1$) up to AOI=54°. However, the efficiency to reduce residual reflections deteriorates drastically as the geometrical layer thicknesses are increased towards higher values, such as $d_{REL}=1.1$ or 1.2. This indicates that the complex structure of the 6-layer antireflection coating is less suitable for "tuning" the coating to shift the acceptance range towards different values.

Figure 7:
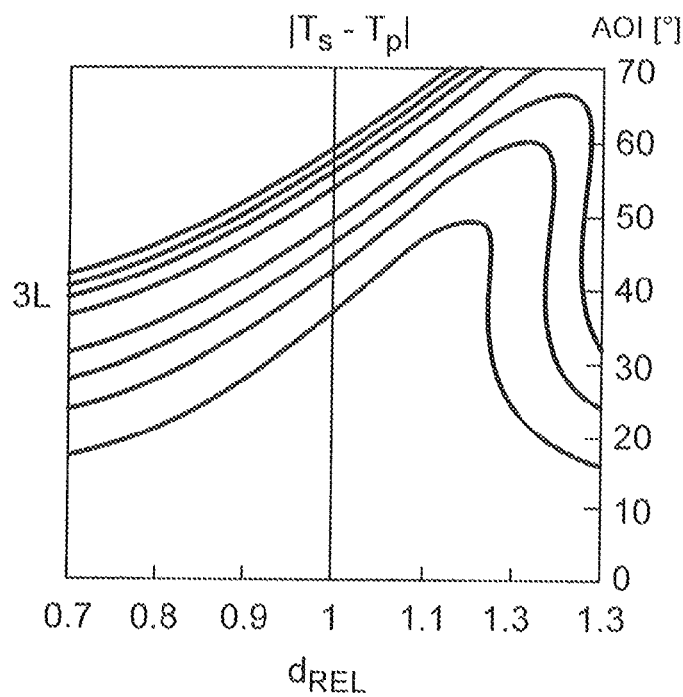
FIG. 7 shows a diagram with contour lines presenting a given value for the polarization selective transmittance difference (transmittance splitting) $|T_S-T_P|$ f a coated optical surface as a function of the relative geometrical thickness $d_{REL}$ of single layers of the multilayer coating and the angle of incidence, AOI, of radiation on the coated optical surface for an antireflection coating with three single layers (3L)
Figure 8:
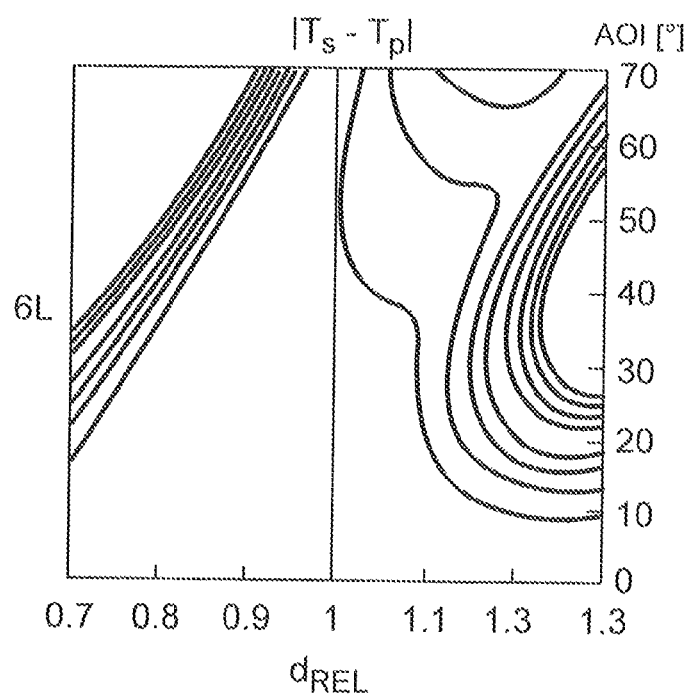
FIG. 8 shows a diagram with contour lines presenting a given value for the polarization selective transmittance difference (transmittance splitting) $|T_S-T_P|$ of a coated optical surface as a function of the relative geometrical thickness $g_{REL}$ of single layers of the multilayer coating and the angle of incidence, AOI, of radiation on the coated optical surface for an antireflection coating with six single layers (6L)

FIGS. 7 and 8 show further illustrations demonstrating the capability of simple 3-layer anti-reflection coatings to design a graded antireflection coating having a local variation of geometrical layer thickness of the single layers constituting the multilayer coating. The diagrams in FIGS. 7 and 8 each show contour lines for the absolute value of the difference of transmittance for s-polarized light ($T_s$) and the transmittance for p-polarized light ($P_P$). This difference, $T_s-P_p$ is also denoted as "transmittance splitting" in this application. FIG. 7 indicating the values for the 3-layer antireflection coating shows that low transmittance splitting values may be maintained even if the geometrical layer thickness of the single coating layers is shifted from the nominal thickness ($d_{REL}=1$) to higher values, for examples by 10% or 20%. On the other hand, FIG. 8 representing the data for the 6-layer structure shows that the transmittance splitting increases drastically as the geometrical layer thickness is increased from the nominal thickness towards higher values.

Figure 9:
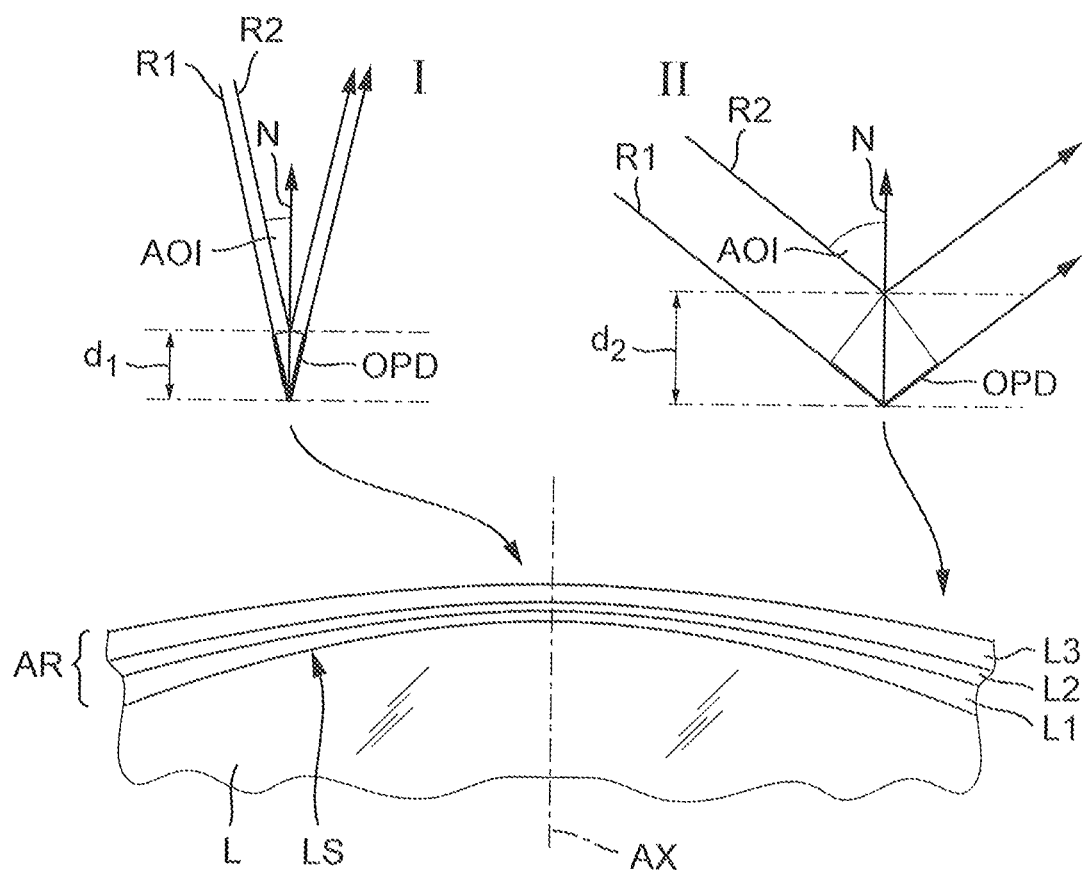
FIG. 9 shows a schematic representation of a convex lens surface coated with a 3-layer graded antireflection coating having a geometrical thickness of layers increasing from the optical axis to the edge of the lens surface.

FIG. 9 is a schematic drawing of a lens element L having a convexly curved lens surface LS coated with a 3-layer antireflection coating AR designed as a graded coating, where the geometrical layer thicknesses of each of the three layers (first layer L1 directly on the lens surface, second layer L2 on first layer L1, and third layer L3) of the antireflection coating varies as a function of the location on the lens surface such that the geometrical layer thickness is smallest around the optical axis AX and increases monotonically in radial direction towards the edge of the lens. The inset FIGS. I and II are intended to indicate the efficiency for reflection reduction of the antireflection coating in terms of the well-known Bragg condition in a simplified structure with only two interfaces. In each case, two rays R1, R2 are incident parallel to each other on an optical surface at an angle of incidence AOI included between the propagation direction of the ray and the surface normal N. A layer thickness d represents the distance between adjacent interfaces from which part of the incident radiation is reflected. An optical path difference OPD generated between the rays R1, R2 upon reflection is drawn in bold lines in the figures. In an antireflection coating, the optical path difference is generally designed to lead to destructive interference between rays such that reflection is effectively reduced. Whereas a nominal thickness $d_1$ is effective at near normal incidence close to the optical axis (inset I), a larger geometrical thickness $d_2 > d_1$ is required closer to the edge of the lens where incident rays R1, R2 have larger angles of incidence than in the region of the optical axis AX.

In FIG. 1, at least each of the lens surfaces S3, S14, S16, S23, S29, S40, S48, S50 and S56 obeying the conditions $AOI_{MAX} > 35°$ and $\Delta AOI_{MAX} < 35°$ is coated with a graded 3-layer antireflection coating generally in accordance with the layer structure schematically depicted in FIG. 9. Therefore, efficient reflection reduction may be obtained even in regions of high incidence angles close to the edges of the lenses by using a low-absorption 3-layer antireflection coating.

Figure 10:
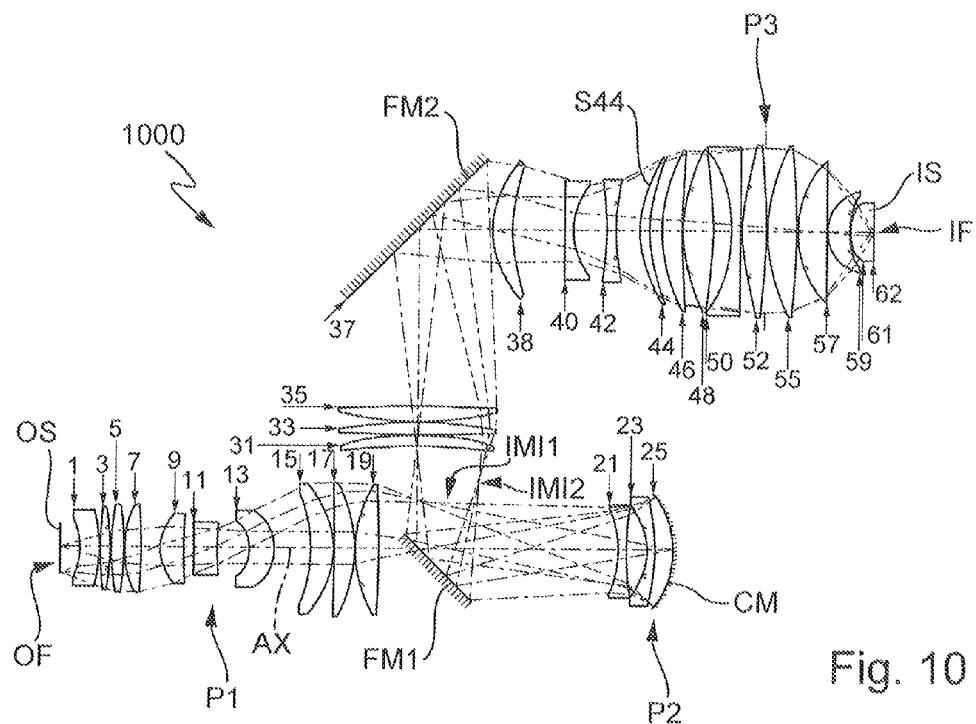
FIG. 10 illustrates a lens section of a second embodiment of a catadioptric projection objective with lenses coated according to an aspect of the disclosure.

FIG. 10 shows a projection objective 1000 optimized with regard to lens heating by using low absorption, 3-layer antireflection coatings on selected lens surfaces obeying the conditions $AOI_{MAXG} > A_C = 35°$ and $\Delta AOI < A_C = 35°$.

The projection objective is designed for a nominal UV-operating wavelength $\lambda = 193$ nm. The layout of the projection objective with regard to number, shape, position of lenses and other optical elements is taken from the prior art projection objective shown in FIG. 19 and discussed as embodiment 7 (Tables 13 and 14) in EP 1 480 065 A1. The respective disclosure of that reference is incorporated herein by reference. An image-side numerical aperture NA=1.30 may be obtained at a reducing magnification 4:1 in a rectangular or arc shaped off-axis image field.

Projection objective 1000 is designed to project an image of a pattern on a reticle arranged in the planar object surface OS (object plane) into the planar image surface IS (image plane) on a reduced scale, for example, 4:1, while creating exactly two real intermediate images IMI1, IMI2. The effective object field OF and image field IF are off-axis, i.e. entirely outside the optical axis AX. A first refractive objective part OP1 is designed for imaging the pattern in the object surface into the first intermediate image IMI1. A second, catadioptric (refractive/reflective) objective part OP2 images the first intermediate image IMI1 into the second intermediate image IMI2. A third, refractive objective part OP3 images the second intermediate image IMI2 onto the image surface IS with a strong reduction ratio. The folding geometry is different from FIG. 1.

The second objective part OP includes a single concave mirror CM at the second pupil surface P2 and coaxial with the section of the optical axis defined by the first objective part. Radiation originating from the first intermediate image IMI1 and reflected by the concave mirror C2 is incident on a first folding mirror FM1 arranged optically between the concave mirror and the second intermediate image IMI2 at 45° to the optical axis AX. A second folding mirror, FM2, having a planar mirror surface aligned at right angles to the planar mirror surface of the first folding mirror FM1, reflects radiation coming from the first folding mirror and the second intermediate image IMI2 towards the image surface IS.

Figure 11:
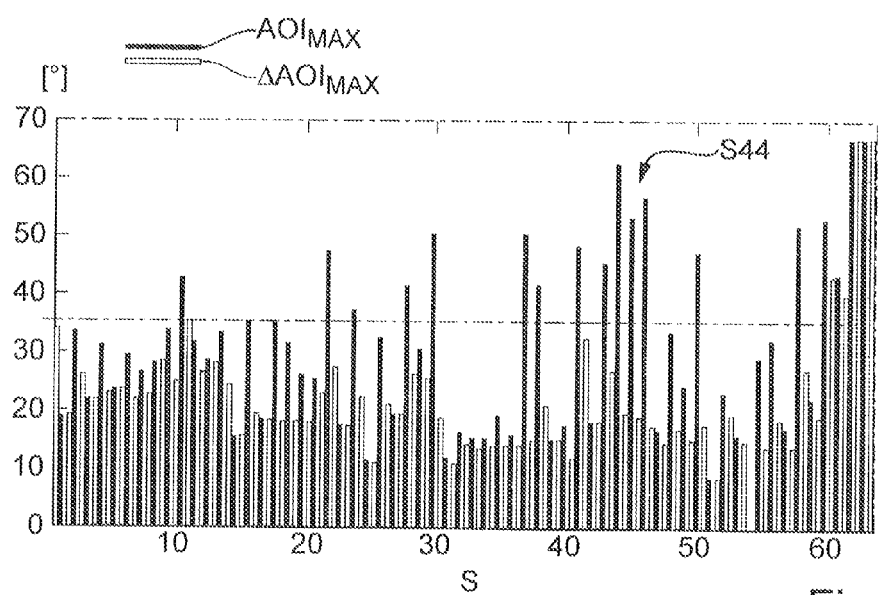
FIG. 11 is a bar diagram showing for each optical surface with a surface number S of the embodiment of FIG. 1, a pair of bars indicating the maximum angle of incidence, $AOI_{MAX}$ and the maximum value of the local ranges of angles of incidence, $\Delta AOI_{MAX}$.

FIG. 11 shows an analysis of all optical surfaces of the projection objective similar to FIG. 2. Therefore, reference is made to the respective description. It is evident from FIG. 11 that the maximum range of angles of incidence, $\Delta AOI_{MAX}$, is smaller than 35° for all lens surfaces except for the planar exit surface of the projection objective immediately adjacent to the image surface and three lens surfaces immediately upstream thereof, i.e. for surfaces S60, S61, S62 and S63. At the same time, the maximum angle of incidence, $AOI_{MAX}$ is smaller than 35° for many of the lenses indicating that most lenses are relatively relaxed with regard to angular load. This is partly due to the relatively large optical distance between object surface and image surface when compared to FIG. 1. However, a number of lens surfaces is subject to relatively larger maximum angles of incidence $AOI_{MAX} > 40°$ or $>50°$ and even $>60°$. Specifically, lens surfaces S11, S22, S24, S29, S30, S37, S38, S41, S43, S44, S45 and S46 obey the conditions: $AOI_{MAXG} > A_C = 35°$ and $\Delta AOI < A_C = 35°$.

Figure 12:
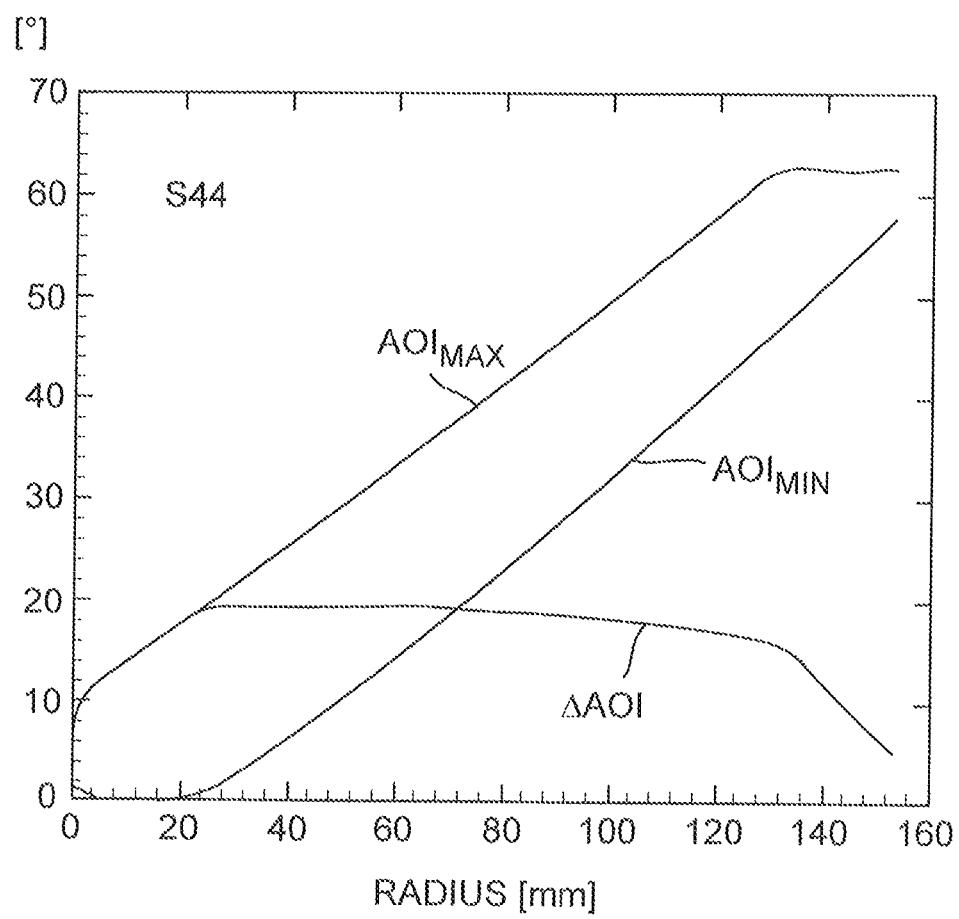
FIG. 12 is a diagram showing, for surface S44 in FIG. 10, the maximum angle of incidence, $AOI_{MAX}$, the minimum angle of incidence, $AOI_{MIN}$, and the range of angles of incidence, $\Delta AOI$, as a function of the radius coordinate of the lens surface between the optical axis (radius=0) and the outer edge of the lens.

The situation at lens surface L44, being a convex entry surface of a thin positive meniscus lens arranged in the third objective part OP3 in an intermediate zone between the second intermediate image IMI2 and the third pupil surface P3 at a position with RHR≈0.15, is depicted in detail in FIG. 12 in a manner described in detail in connection with FIG. 3. It is seen that the local range of angles of incidence, $\Delta AOI$, is smaller than 20° for all radial positions, although the maximum and the minimum angles of incidence increase almost linearly between the region of the optical axis and the edge of the lens.

Figure 13:
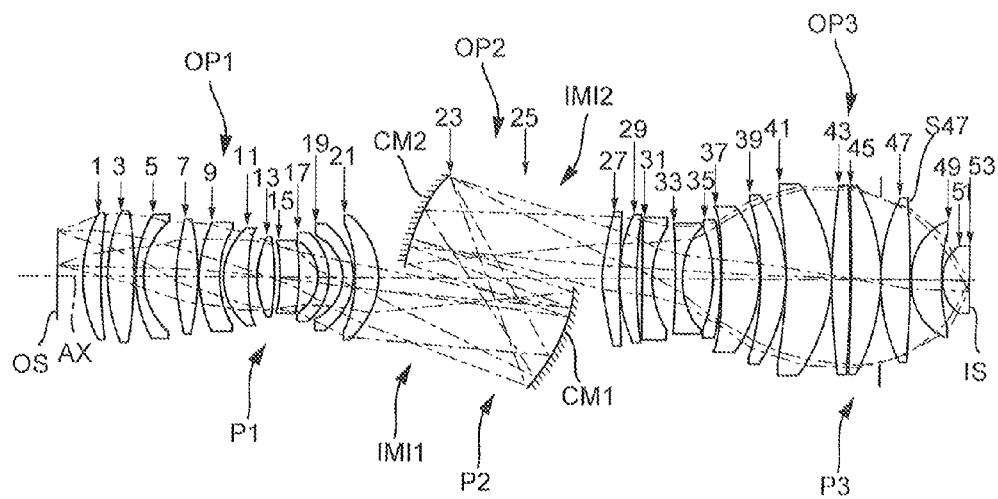
FIG. 13 illustrates a lens section of a third embodiment of a catadioptric projection objective with lenses coated according to an aspect of the disclosure.

FIG. 13 shows a projection objective 1300 designed for ca. 193 nm UV operating wavelength. It is designed to project an image of a pattern on a reticle arranged in the planar object surface OS (object plane) into the planar image surface IS (image plane) on a reduced scale, for example, 4:1, while creating exactly two real intermediate images IMI1, IMI2. A first refractive objective part OP1 is designed for imaging the pattern in the object surface into the first intermediate image IMI1 at an enlarged scale. A second, catoptric (purely reflective) objective part OP2 images the first intermediate image IMI1 into the second intermediate image IMI2 at a magnification close to 1:1. A third, refractive objective part OP3 images the second intermediate image IMI2 onto the image surface IS with a strong reduction ratio. The second objective part OP2 comprises a first concave mirror CM1 having the concave mirror surface facing the object side, and a second concave mirror CM2 having the concave mirror surface facing the image side. The mirror surfaces are both continuous or unbroken, i.e. they do not have a hole or bore in the illuminated area used for reflection. The mirror surfaces facing each other define a catadioptric cavity, which is also denoted inter-mirror space, enclosed by the curved surfaces defined by the concave mirrors. The intermediate images IMI1, IMI2 are both situated inside the catadioptric cavity well apart from the mirror surfaces.

Each mirror surface of a concave mirror defines a "curvature surface" or "surface of curvature" which is a mathematical surface extending beyond the edges of the physical mirror surface and containing the mirror surface. The first and second concave mirrors are parts of rotationally symmetric curvature surfaces having a common axis of rotational symmetry.

The objective 1300 is rotational symmetric and has one straight optical axis AX common to all refractive and reflective optical components. There are no folding mirrors. The concave mirrors have small diameters allowing to bring them close together and rather close to the intermediate images lying in between. The concave mirrors are both constructed and illuminated as off-axis sections of axial symmetric surfaces. The light beam passes by the edges of the concave mirrors facing the optical axis without vignetting.

The projection objective 1300 is designed as an immersion objective for $\lambda=193$ nm having an image side numerical aperture NA=1.2 when used in conjunction with the high index immersion fluid, e.g. pure water, between the exit surface of the objective closest to the image surface IS, and the image surface IS. The layout of the objection projective with regard to number, shape, position of lenses and other optical elements is taken from a prior art projection objective shown in FIG. 13 and discussed as embodiment 13 (tables 13, 13A) in WO 2006/005547 A2. The respective disclosure of that reference is incorporated herein by reference.

Figure 14:
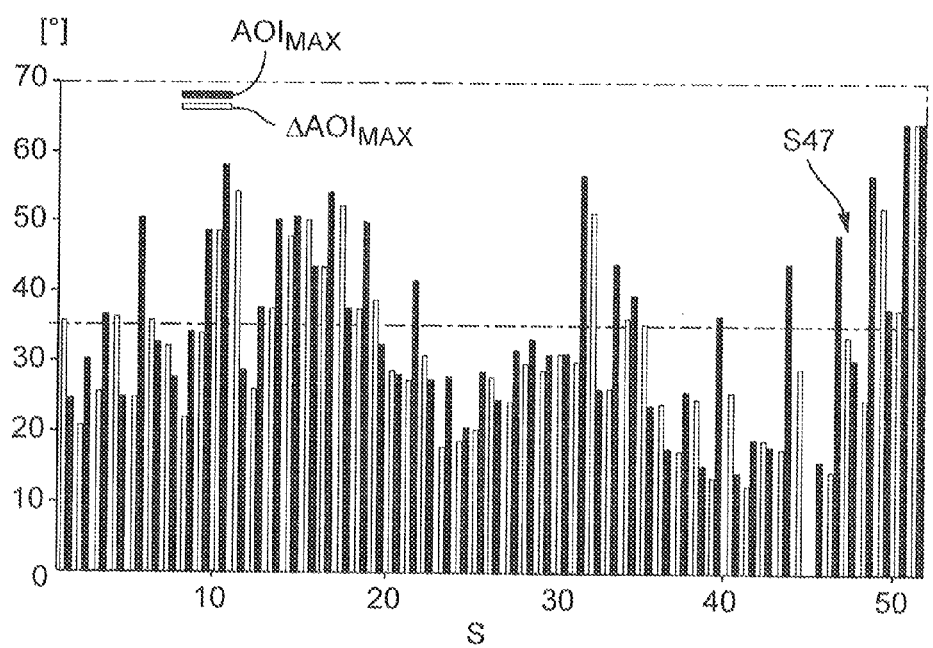
FIG. 14 is a bar diagram showing for each optical surface with a surface number S of the embodiment of FIG. 13, a pair of bars indicating the maximum angle of incidence, $AOI_{-MAX}$ and the maximum value of the local ranges of angles of incidence, $\Delta AOI_{MAX}$.

FIG. 14 shows an analysis of all optical surfaces of the projection objective similar to FIG. 2. Therefore, reference is made to the respective description. It is evident from FIG. 14 that the maximum range of angles of incidence, $\Delta AOI_{MAX}$, is smaller than 35° for many lens surfaces. At the same time, a number of these lens surfaces is subject to relatively large maximum angles of incidence $AOI_{MAX}>40°$ or $>50°$ and even $>60°$. Specifically, lens surfaces S22, S40, S44 and S47 obey the conditions: $AOI_{MAXG}>A_C=35°$ and $\Delta AOI<A_C=35°$.

Figure 15:
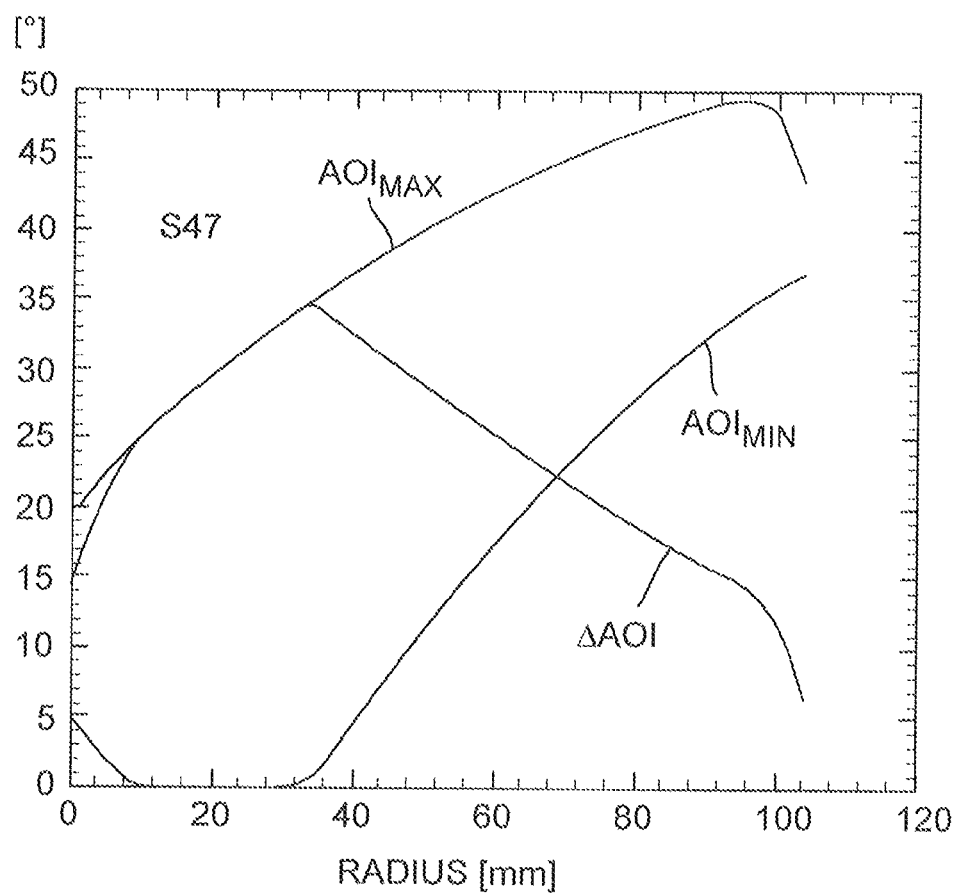
FIG. 15 is a diagram showing, for surface S47 in FIG. 13, the maximum angle of incidence, $AOI_{Max}$, the minimum angle of incidence, $AOI_{MIN}$, and the range of angles of incidence, $\Delta AOI$, as a function of the radius coordinate of the lens surface between the optical axis (radius=0) and the outer edge of the lens.

The situation at lens surface L47, being a convex aspherical exit surface of a biconvex positive lens arranged in the third objective part OP3 between the third pupil surface P3 and the image surface IS at a position with RHR≈0.1 is depicted in detail in FIG. 15 in a manner described in detail in connection with FIG. 3. It is seen that the local range of angles of incidence, $\Delta AOI$, is smaller than 35° for all radial positions.

Figure 16:
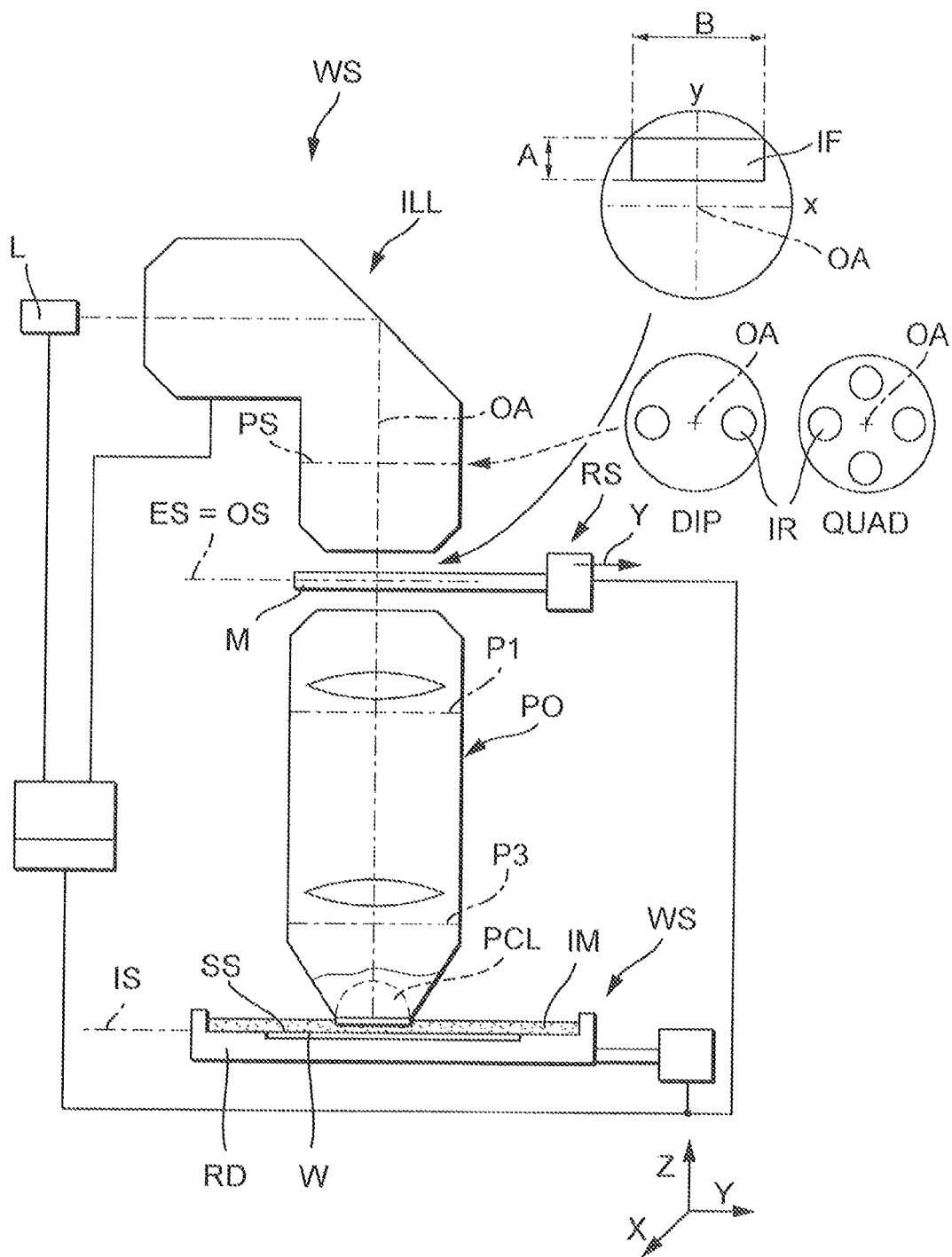
FIG. 16 shows a schematic drawing of a scanning projection exposure system for microlithography having an illumination system designed for creating a slit-shaped illumination field and a catadioptric projection objective.

FIG. 16 shows schematically a microlithographic projection exposure system in the form of a wafer scanner WS, which is provided for fabricating large scale integrated semiconductor components via immersion lithography in a step-and-scan mode. The projection exposure system comprises as light source an excimer laser L having an operating wavelength of 193 nm. Other operating wavelengths, for example 157 nm or 248 nm, are possible. A downstream illumination system ILL generates, in its exit surface ES, a large, sharply delimited, homogeneously illuminated illumination field arranged off-axis with respect to the optical axis of the projection objective PO and adapted to the telecentric requirements of the downstream catadioptric projection objective PO. The illumination system ILL has devices for selecting the illumination mode and, in the example, can be changed over between conventional on-axis illumination with a variable degree of coherence, and off-axis illumination, particularly annular illumination (having a ring shaped illuminated area in a pupil surface of the illumination system) and dipole or quadrupole illumination.

Arranged downstream of the illumination system is a device RS (reticle stage) for holding and manipulating a mask M in such a way that the mask lies in the exit surface ES of the illumination system coinciding with the object surface OS of the projection objective PO and can be moved in this plane for scanning operation in a scanning direction (Y-direction) perpendicular to the optical axis OA common to the illumination system and the projection objective (i.e. the Z-direction).

The size and shape of the illumination field IF provided by the illumination system determines the size and shape of the effective object field OF of the projection objective actually used for projecting an image of a pattern on a mask in the image surface of the projection objective. The slit-shaped illumination field IF has a height A parallel to the scanning direction and a width B>A perpendicular to the scanning direction and may be rectangular (as shown in the inset figure) or arcuate (ring field). An aspect ratio B/A may be in a range from B/A=2 to B/A=10, for example.

The reduction projection objective PO is telecentric at the object and image side and designed to image an image of a pattern provided by the mask with a reduced scale of 4:1 onto a wafer W coated with a photoresist layer. Other reduction scales, e.g. 5:1 or 8:1 are possible. The wafer W serving as a light-sensitive substrate is arranged in such a way that the planar substrate surface SS with the photoresist layer essentially coincides with the planar image surface IS of the projection objective. The wafer is held by a device WS (wafer stage) comprising a scanner drive in order to move the wafer synchronously with the mask M in parallel with the latter. The device WS also comprises manipulators in order to move the wafer both in the Z direction parallel to the optical axis OA and in the X and Y directions perpendicular to the axis. A tilting device having at least one tilting axis running perpendicular to the optical axis is integrated.

The device WS provided for holding the wafer W (wafer stage) is constructed for use in immersion lithography. It comprises a receptacle device RD, which can be moved by a scanner drive and the bottom of which has a flat recess for receiving the wafer W. A peripheral edge forms a flat, upwardly open, liquidtight receptacle for a liquid immersion medium IM, which can be introduced into the receptacle and discharged from the latter via devices that are not shown. The height of the edge is dimensioned in such a way that the immersion medium that has been filled in can completely cover the surface SS of the wafer W and the exit-side end region of the projection objective PO can dip into the immersion liquid given a correctly set operating distance between objective exit and wafer surface.

The projection objective PO has a planoconvex lens PCL as the last optical element nearest to the image surface IS, the planar exit surface of the lens being the last optical surface of the projection objective PO. During operation of the projection exposure system, the exit surface of the last optical element is completely immersed in the immersion liquid IM and is wetted by the latter. In the exemplary case, ultrapure water having a refractive index $n_I \approx 1.437$ (193 nm) is used as the immersion liquid.

Various different illumination settings may be set with the illumination system ILL. For example, where the pattern of the mask to be projected on the wafer essentially consists of parallel lines running in one direction, a dipole setting DIP (see left inset figure) may be utilized to increase resolution and depth of focus. To this end, adjustable optical elements in the illumination system are adjusted to obtain, in a pupil surface PS of the illumination system ILL, an intensity distribution characterized by two locally concentrated illuminated regions IR of large light intensity at diametrically opposed positions outside the optical axis OA and little or no light intensity on the optical axis. A similar inhomogeneous intensity distribution is obtained in pupil surfaces of the projection objective optically conjugate to the pupil surface of the illumination system. As a result, lenses at or near the first and third pupil surfaces P1, P3, respectively, of projection objectives described above may be subject to spatially inhomogeneous radiation loads characterized by two "hot areas" at diametrically opposed regions outside the optical axis, which may lead to local absorption-induced lens heating, causing characteristic lens deformations and refractive index variations, which, in turn, cause a characteristic deformation of the wavefront characterized by an essentially two-fold radial symmetry with respect to the optical axis. The illumination setting may be changed to obtain, for example, conventional illumination (rotational symmetry around the optical axis) or quadrupole illumination (four-fold radial symmetry around the optical axis, see right hand side inset figure QUAD with four off-axis illuminated regions IR). Quadrupole illumination may cause lens heating resulting in a characteristic deformation of the wavefront characterized by an essentially two-fold or four-fold radial symmetry with respect to the optical axis.

Illumination systems capable of optionally providing the described off-axis polar illumination modes are described, for example, in U.S. Pat. No. 6,252,647 B1 or in applicant's patent application US 2006/0050261 A1, the disclosure of which is incorporated herein by reference.

The effects of lens heating may be significantly reduced relative to conventional projection objectives if some all lens surfaces fulfilling the condition $AOI_{MAXG} > A_C = 35$ and $\Delta AOI < A_C = 35$ are coated with a graded, low-absorption antireflection coating.

The above description has been given by way of example. From the disclosure given, those skilled in the art will not only understand the present disclosure and its attendant advantages, but will also find apparent various changes and modifications to the structures and methods disclosed. The applicant seeks, therefore, to cover all such changes and modifications as fall within the spirit and scope of the disclosure, as defined by the appended claims, and equivalents thereof.

The contents of the claims are incorporated by reference into the description.

What is claimed is:

1. An objective comprising:
 a plurality of optical elements having optical surfaces arranged to be capable of imaging an object surface of the objective onto an image surface of the objective with radiation having an operating wavelength forming a radiation beam; and
 a low absorption coating having at least one layer of material,
 wherein:
   the radiation beam includes a plurality of rays incident on the optical surfaces with a plurality of respective angles of incidence, AOI, defining, for each location on an optical surface, a local maximum angle of incidence, $AOI_{MAX}$, a local minimum angle of incidence, $AOI_{MIN}$, and a local range of angles of incidence, $\Delta AOI = AOI_{MAX} - AOI_{MIN}$;
   for each optical surface the global maximum angle of incidence, $AOI_{MAXG}$ is the maximum angle of incidence occurring on the respective optical surface;
   at least one of the optical elements is a first element having a first surface having a surface shape and a surface position such that the global maximum angle of incidence, $AOI_{MAXG}$, exceeds a critical angle $A_C$ and the global maximum angle of incidence, $AOI_{MAXG}$, exceeds an angle of 40°;
   the local range of angles of incidence, $\Delta AOI$, for the at least one of the optical elements is equal to or less than the critical angle $A_C$ for all locations on the first surface;
   the low absorption coating is a graded coating;
   the low absorption coating is applied to the first surface;
   a geometrical layer thickness of the at least one layer of the coating varies as a function of the location of the first surface; and
   the objective is configured to be used as a projection objective of a microlithography projection exposure apparatus.

2. The objective according to claim 1, wherein the condition $A_C = 35°$ holds for the critical angle.

3. The objective according to claim 1, wherein the global maximum angle of incidence, $AOI_{MAXG}$, exceeds 50° on the first surface where the local range of angles of incidence, $\Delta AOI$, is equal to or less than the critical angle $A_C$ for all locations on the first surface.

4. The objective according to claim 1, wherein the condition $A_C = 35°$ holds for the critical angle and the global maximum angle of the incidence, $AOI_{MAXG}$, exceeds the critical angle by at least 10° on the first surface.

5. The objective according to claim 1, wherein the low absorption coating has three or less layers of material.

6. The objective according to claim 1, wherein the low absorption coating has exactly three layers of material.

7. The objective according to claim 1, wherein a geometrical layer thickness of the layers of the coating increases from a center region around an optical axis of the first element towards an edge region of the first element by at least 10%.

8. The objective according to claim 1, wherein the material used for the at least one layer of the coating is essentially free of absorption at the operating wavelength of the objective.

9. The objective according to claim 1, wherein the material used for the at least one layer of the coating has a complex refractive index $N = n - ik$, wherein n is the real refractive index and k is the absorption index at the operating wavelength, and wherein the absorption coefficient k is below $10^{-6}$.

10. The objective according to claim 1, wherein the coating has a first layer, directly applied to the first surface, a second layer applied to the first layer, and a third layer applied to the second layer, wherein the first layer is made of a first low refractive index material, the second layer is made of the second high-refractive index material, and the third layer is made of a third, low refractive index material.

11. The objective according to claim 10, wherein the first layer has an optical layer thickness of from $0.05\lambda_0$ to $0.15\lambda_0$, the second layer has an optical film thickness of from $0.2\lambda_0$ to $0.35\lambda_0$ and the third layer has an optical film thickness of from $0.2\lambda_0$ to $0.3\lambda_0$.

12. The objective according to claim 10, wherein the low refractive index materials used for the first and third layer comprise at least one material selected from the group consisting of magnesium fluoride, aluminium fluoride, sodium fluoride, lithium fluoride, calcium fluoride, barium fluoride, strontium fluoride, cryolite, chiolite, and combinations thereof.

13. The objective according to claim 10, wherein the high refractive index material used for the second layer comprises a material selected from the group consisting of neodymium fluoride, lanthanum fluoride, gadolinium fluoride, dysprosium fluoride, aluminium oxide, lead fluoride, yttrium fluoride, and combinations thereof.

14. The objective according to claim 1, wherein the objective has 30 or more optical surfaces, and at least 60% of all optical surfaces fulfilling the conditions $AOI_{MAXG} > A_C$ and $\Delta AOI < A_C$ are coated with a graded, low-absorption coating.

15. The objective according to claim 1, wherein the objective has at least one pupil surface between the object surface and the image surface, and at least one optical surface arranged in a pupil space optically close to the pupil surface is coated with a graded low-absorption coating.

16. The objective according to claim 1, wherein the objective is a catadioptric projection objective configured to image an off-axis object field arranged in the object surface into an off-axis image field arranged in the image surface of the objective and includes at least one concave mirror.

17. The objective according to claim 1, wherein the objective has at least one intermediate image.

18. The objective according to claim 1, wherein the objective has an image-side numerical aperture NA>0.8.

19. The objective according to claim 1, wherein the objective is a catadioptric projection objective configured to image an off-axis object field arranged in the object surface into an off-axis image field arranged in the image surface of the objective and includes at least one concave mirror, and wherein the objective comprises at least one intermediate image and has an image-side numerical aperture NA>0.8.

20. The objective according to claim 1, wherein the objective is adapted with regard to imaging aberrations to a dry process where an image space between an exit surface of the objective and the image surface is filled with a gas having refractive index close to 1 during use of the objective.

21. The objective according to claim 20, wherein the objective has an image-side numerical aperture NA>0.8.

22. The objective according to claim 1, wherein the objective is designed as an immersion objective adapted with regard to imaging aberrations to a wet process where an image space between an exit surface of the objective and the image surface is filled with an immersion medium having refractive index significantly larger than 1 during use of the objective.

23. The objective according to claim 22, wherein the objective has an image-side numerical aperture NA>1.0 when used in connection with an immersion medium having refractive index $n_I > 1.3$.

24. The objective according to claim 1, further comprising:
a first refractive objective part configured to generate a first intermediate image from radiation coming from the object surface and including a first pupil surface;
a second objective part including at least one concave mirror configured to image the first intermediate image into a second intermediate image and including a second pupil surface optically conjugated to the first pupil surface; and
a third refractive objective part configured to image the second intermediate image onto the image surface and including a third pupil surface optically conjugated to the first and second pupil surface.

25. The objective according to claim 24, wherein the objective forms exactly two intermediate images.

26. The objective according to claim 24, wherein the second objective part has exactly one concave mirror close to or at the second pupil surface, and the objective has a first folding mirror configured to deflect radiation coming from the object surface in the direction of the concave mirror, or for configured to deflect radiation coming from the concave mirror towards the image surface.

27. The objective according to claim 26, further comprising a second folding mirror configured to deflect radiation coming from the concave mirror or the first deflecting mirror in the direction of the image surface.

28. The objective according to claim 24, wherein the second objective part has exactly two concave mirrors, each optically remote from a pupil surface.

29. The objective according to claim 28, wherein the objective has one straight optical axis common to all optical elements.

30. An apparatus comprising:
a light source configured to generate primary radiation;
an illumination system, comprising:
a plurality of optical elements constructed and arranged to receive the primary radiation and to generate illumination radiation incident on a mask bearing a pattern;
a number of the optical elements forming a pupil-shaping unit configured to generate a defined spatial intensity distribution corresponding to selected illumination mode in a pupil surface of the illumination system, the spatial intensity distribution being a multipolar intensity distribution including at least one substantially dipolar intensity distribution having at least two illumination poles positioned outside an optical axis of the illumination system; and
a projection objective according to claim 1,
wherein the projection objective is configured to project an image of the pattern onto a radiation-sensitive substrate with projection radiation guided along a projection path, and the apparatus is a projection exposure apparatus.

31. An apparatus, comprising:
an illumination system; and
a projection objective as claimed in claim 1,
wherein the apparatus is a projection exposure apparatus.

* * * * *

UNITED STATES PATENT AND TRADEMARK OFFICE
CERTIFICATE OF CORRECTION

PATENT NO. : 8,441,613 B2  
APPLICATION NO. : 13/050346  
DATED : May 14, 2013  
INVENTOR(S) : Ralf Mueller Page 1 of 1

It is certified that error appears in the above-identified patent and that said Letters Patent is hereby corrected as shown below:

In the Specification

Column 4, Line 1, delete "bandwith" insert -- bandwidth --;

Column 6, Line 54, delete "lithograpy" insert -- lithography --;

Column 9, Line 6, delete "f a" insert -- of a --;

Column 9, Line 15, delete "$g_{REL}$" insert -- $d_{REL}$ --;

Column 9, Line 41, delete "$AOI\text{-}_{MAX}$" insert -- $AOI_{MAX}$ --;

Column 9, Line 45, delete "$AOI_{Max}$" insert -- $AOI_{MAX}$ --;

Column 14, Line 59, delete "$(P_p)$." insert -- $(T_p)$. --;

Column 14, Line 59, delete "$T_s\text{-}P_p$" insert -- $T_s\text{-}T_p$ --;

Column 18, Line 11, after "field" delete "OF".

Signed and Sealed this  
First Day of October, 2013

Teresa Stanek Rea  
*Deputy Director of the United States Patent and Trademark Office*